United States Patent [19]

Gemba

[11] 4,250,473
[45] Feb. 10, 1981

[54] CIRCUIT BOARD HAVING PRINTED THEREON CONDUCTIVE PATTERNS TO BE CONNECTED WITH INPUT AND OUTPUT LEAD WIRES OF ACOUSTIC SURFACE WAVE FILTER ELEMENT

[75] Inventor: Tomoji Gemba, Kumagaya, Japan

[73] Assignee: Tokyo Shibaura Electric Co., Ltd., Kawasaki, Japan

[21] Appl. No.: 886,607

[22] Filed: Mar. 14, 1978

[30] Foreign Application Priority Data

Mar. 17, 1977 [JP] Japan .............................. 52/31433[U]

[51] Int. Cl.² ...................... H03H 9/04; H03H 9/26; H03H 9/32; H01L 41/04
[52] U.S. Cl. .............................. 333/193; 310/313 B; 333/151; 333/194
[58] Field of Search .................. 333/72, 30 R, 25-27, 333/24; 330/53, 149, 5.5; 310/313, 345, 348; 358/21, 35-38, 160, 166, 167, 904, 905; 361/401, 409, 397, 399, 400, 402, 403-406

[56] References Cited

U.S. PATENT DOCUMENTS 3,805,194  4/1974  Moulding .............................. 333/25
4,126,839  11/1978  Yamanoi et al. ......................... 333/72

FOREIGN PATENT DOCUMENTS 46-466  8/1971  Japan .

OTHER PUBLICATIONS

Kubo-"Designing of High Frequency Circuits", CQ Press, 1973; pp. 80-81.
Itoh-"Earth and Noise", 1974; pp. 78-81.

Primary Examiner—Marvin I. Nussbaum
Attorney, Agent, or Firm—Cushman, Darby & Cushman

[57] ABSTRACT

An acoustic surface wave filter element provided with two input and two output pins connected with the input and the output interdigital electrodes, respectively and an earth pin connected with a filter element shield casing is disposed on one surface of a circuit board, with the five pins extending through corresponding through holes in the circuit board to the other surface of the circuit board on which the pins are connected with corresponding conductive circuit patterns of the circuit board. The circuit patterns include a first signal pattern to be connected with one of the input pins, a first earth pattern connected with the other of the input pins, a second and a third signal pattern connected with one and another of the output pins, and a second earth pattern connected with the earth pin of the filter element. The first and the second signal pattern have end portions opposedly positioned to each other, and an earth pattern portion is positioned between the opposed end portions of the first and the second signal pattern to connect the first and the second earth pattern with each other. Portions of the patterns positioned beneath the filter element are arrayed symmetrically about an axis lying on the center of the terminal of the end portion of the first signal pattern and external between the second and third signal patterns.

16 Claims, 9 Drawing Figures

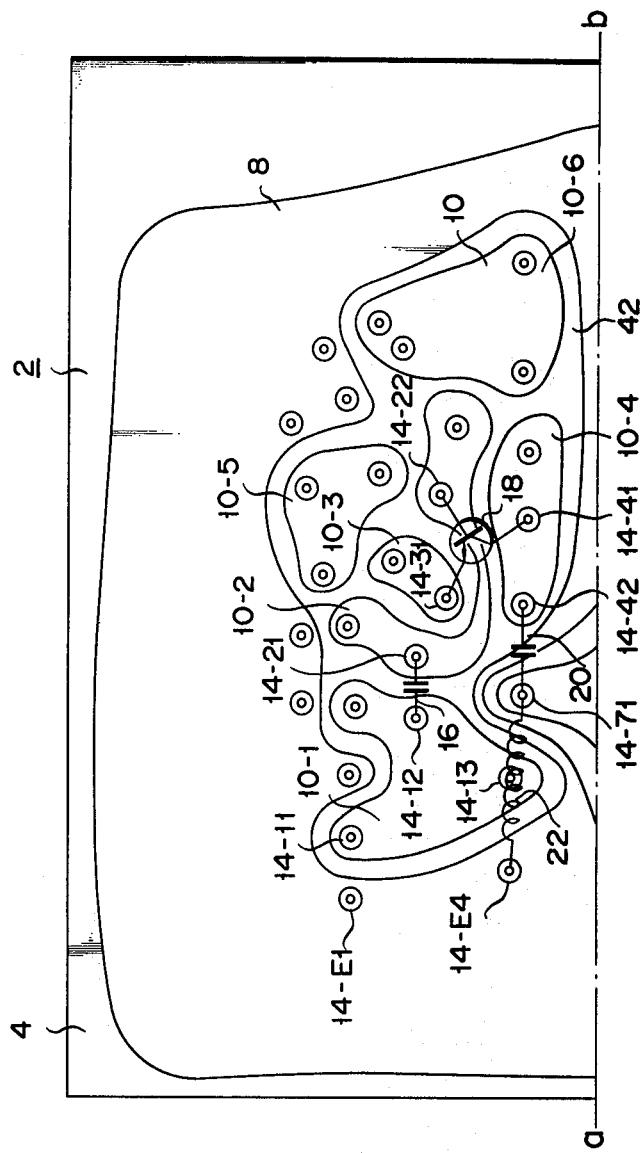
F I G. 1A

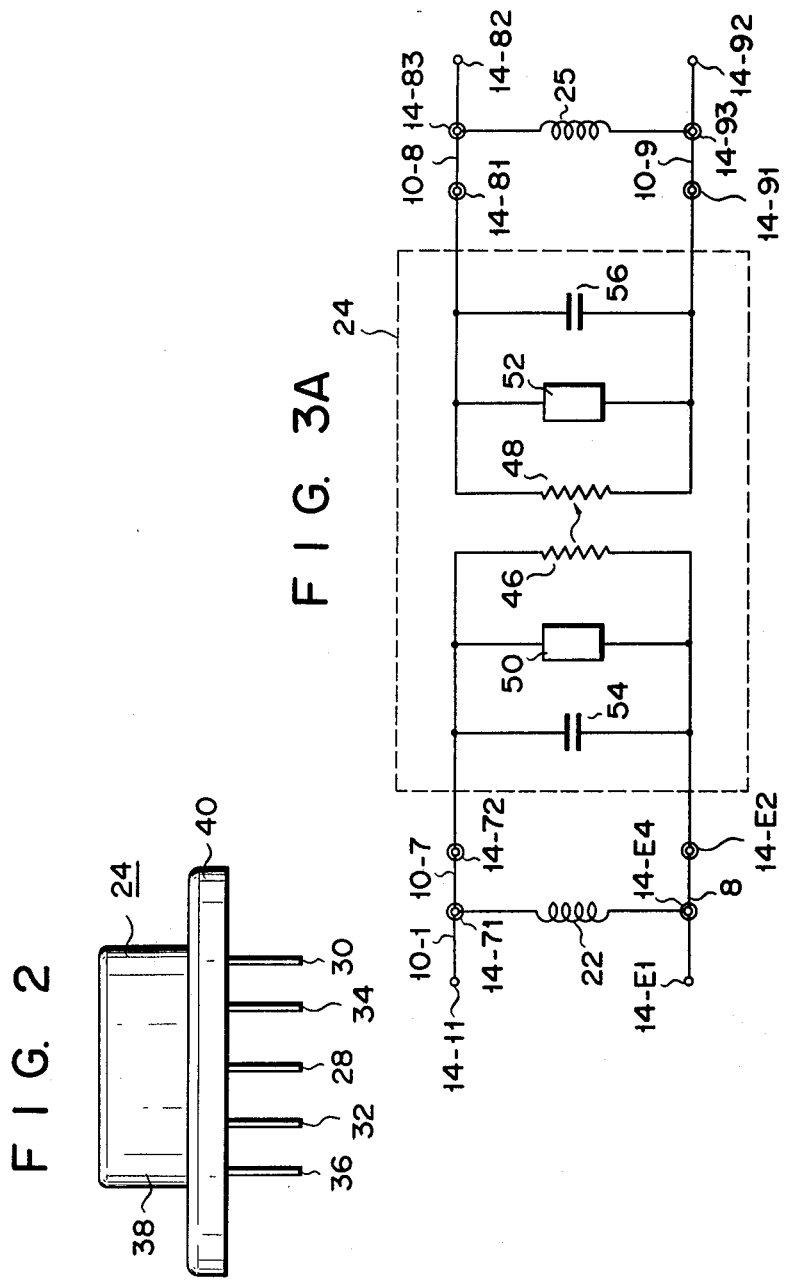

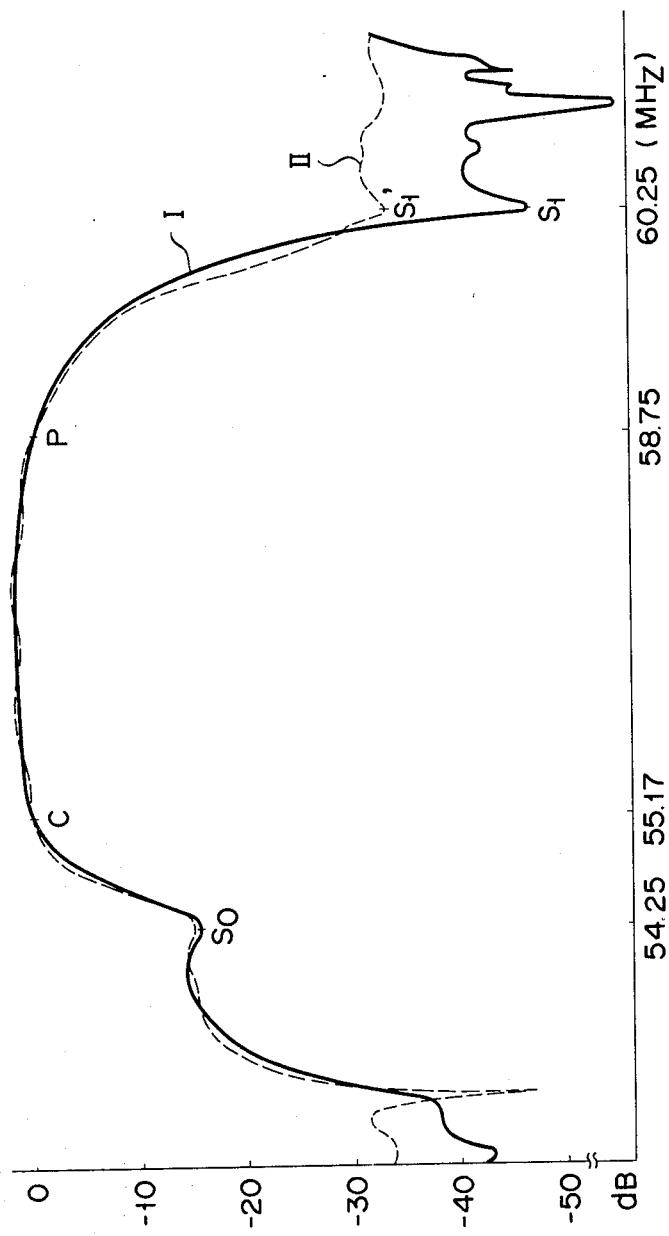

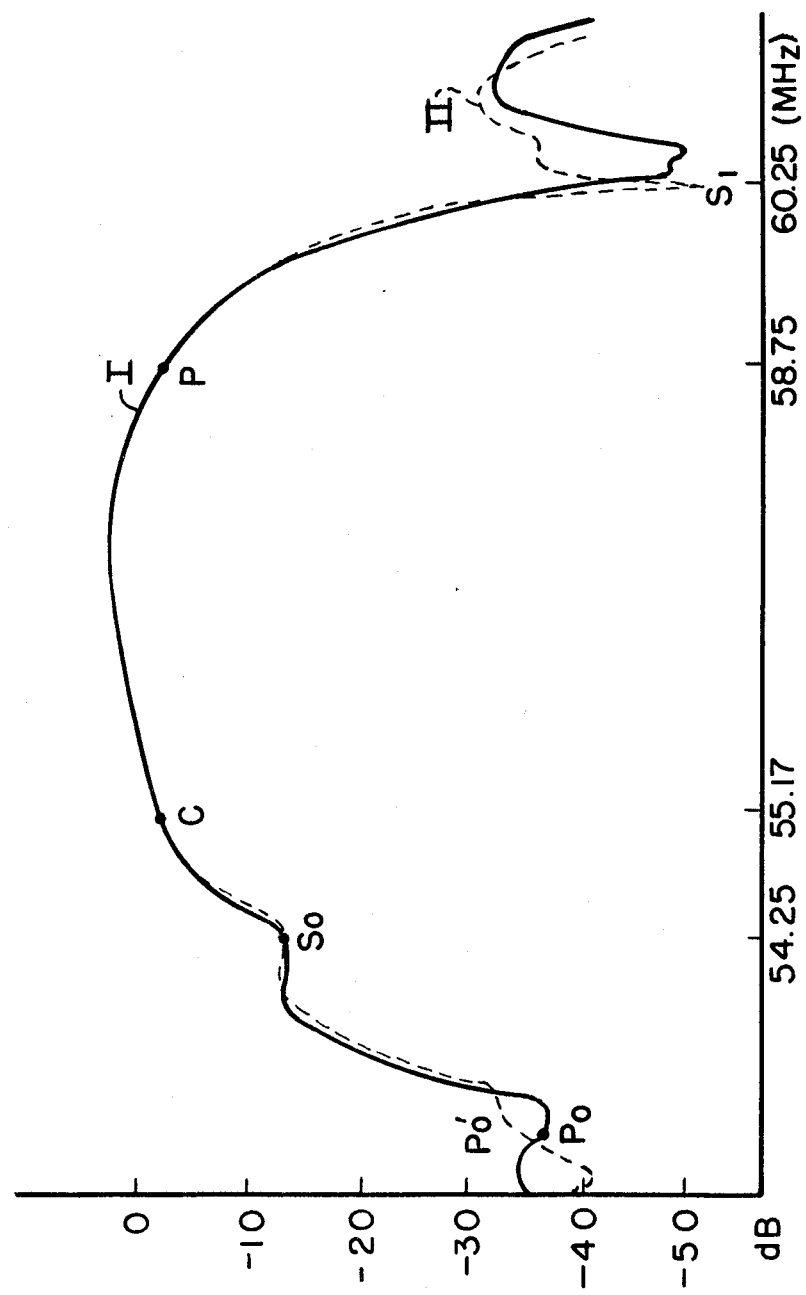

CIRCUIT BOARD HAVING PRINTED THEREON CONDUCTIVE PATTERNS TO BE CONNECTED WITH INPUT AND OUTPUT LEAD WIRES OF ACOUSTIC SURFACE WAVE FILTER ELEMENT

This invention relates to a printed circuit board which has printed thereon conductive patterns to be connected with input and output lead wires of an acoustic surface wave filter element having a desired frequency characteristic, and particularly to a printed circuit board for the video intermediate frequency circuit (VIF circuit) in television receiver sets.

Acoustic surface wave filters (ASF) are well-known and their use in video intermediate frequency circuits in television receiver sets has been taught in U.S. Pat. No. 3,582,838. The acoustic surface wave filter elements are a kind of filter element wherein an electrical signal applied to the input lead wires is internally propagated in the form of an acoustic oscillation to derive an electrical signal in the output lead wires. The acoustic surface wave filter elements are normally mounted, together with other circuit elements, on circuit boards to provide certain circuit parts. It has, however, been observed in operation of such a filter element mounted on a circuit board with the input and the output lead wires connected with patterns printed on the board that unnecessary, undesirable response signals are derived into the output lead wires earlier than the desired output signals derived through propagation in the filter element from those applied to the lead wires.

Such unnecessary response signals cause production of particularly beat patterns and ghost images in television receiver sets.

Accordingly, one of the objects of the invention is to provide a printed circuit board which has printed thereon conductive patterns connected with the input and the output lead wires of an acoustic surface wave filter element having a desired frequency characteristic whereby to minimize the influence of such unnecessary response signals derived into the output lead wires of the acoustic surface wave filter element.

Another object of the invention is to provide a printed circuit board for video intermediate frequency circuits of television receiver sets, avoiding occurrence of ghost images and beat patterns by minimizing the influence of an undesired parasitic filter formed between the input and output terminals of an acoustic surface wave filter.

According to the invention, provided is a circuit board including:
an insulating board having its one surface to be provided with an acoustic surface wave filter element and two pairs of through holes formed therein to respectively receive paired input and paired output lead wires of the filter element; and
a plurality of conductive patterns formed on the other surface of said insulating board to be correspondingly connected with the four lead wires extending through the through holes and protruding from the other surface of said insulating board;
the plurality of conductive patterns including a first signal pattern to be connected with one of the input lead wires for the application of an input signal, a second and a third signal pattern both having first end portions to be connected with one and another of the output lead wires and the second end portions of the said signal patterns to be connected with the input lead wires of a differential amplifier, the first end portions being positioned adjacent the first signal pattern, and an earth pattern surrounding the first, second and third signal patterns and to be connected with the other of the input lead wires of the filter element, the patterns being arranged in an array such that voltages inductively generated the second and third signal patterns by action of a current flowing through the filter element between the first signal and the earth pattern are substantially equivalent to each other.

This invention can be more fully understood from the following detailed description when taken in conjunction with the accompanying drawings, in which:

FIGS. 1A and 1B represent one figure parted by line a-b, which figure is a plan view of a circuit board according to one embodiment of the invention, showing part of the surface thereof on which a circuit pattern is disposed;

FIG. 2 is a side view of an acoustic surface wave filter element;

FIG. 3A is a diagram of an ideal equivalent circuit including the acoustic surface wave filter element and the related circuit elements;

FIG. 6 is a graph showing curves I and II indicative of frequency characteristics of television signals provided, respectively, in a circuit board embodied by the invention, and in a circuit board having a non-equilibrated stray capacitance in the circuit patterns connected with the input and output lead wires of the acoustic surface wave filter element; and FIG. 7 is a graph illustrating how an undesired response is generated by mutual inductance.

Figure 1B:
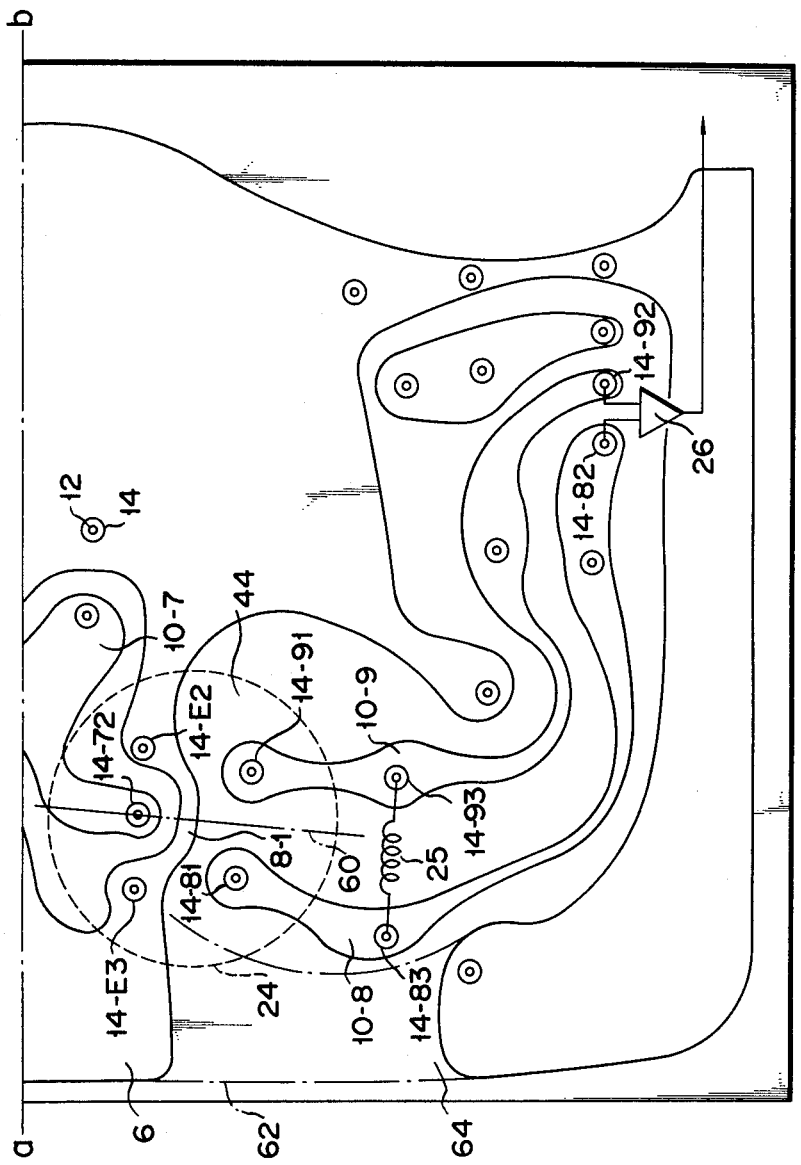

Referring to FIGS. 1A and 1B showing a printed circuit board 2 according to one embodiment of the invention, circuit elements such as resistors, capacitors, coils, for as b matching, semiconductors, and the like are arranged on one surface (not shown) of an insulating board 4 of the circuit board 2. On the other surface thereof, a printed pattern 6 is formed as shown by the well-known printing technique, and comprises an earth pattern 8 and a plurality of signal patterns 10, the latter being principally surrounded by the earth pattern 8. The earth pattern 8 and the signal patterns 10 have a plurality of through holes 12 formed in determined positions thereof to extend through the insulating board 4. Said circuit elements arranged on one surface of insulating board 4 have the respective lead wires extending through the through holes 12 and the distal ends of these lead wires protrude from the other surface of insulating board 4. Thus, the protruding distal ends of the lead wires are positioned in place and soldered on pads 14 disposed on printed pattern 6 so that the respective circuit elements are electrically connected with the earth pattern 8 and/or the signal patterns of printed pattern 6. Some circuit elements that are necessary for description of the circuit board are exclusively illustrated by symbols at 16, 18, 20, 22, 24, 25 and 26. It should be understood that other than the illustrated elements are in fact disposed on the one surface of circuit board and electrically connected with the printed circuit patterns, but which elements are omitted from the illustration for convenience of explanation.

Description will hereinafter be made of an acoustic surface wave filter element 24 and related circuit elements 16, 18, 20, 22 and 26 mounted on a circuit board 2 and to circuit patterns for electrically connecting these circuit elements. As shown in FIG. 2, the acoustic surface wave filter element 24 usually has five lead wires or lead pins 28, 30, 32, 34 and 36 of an equal length and is housed in a shield casing 38 for shielding the same. Of the five lead wires, two input leads wires 28 and 30 are connected with two input interdigital electrodes (not shown) and two output lead wires 32 and 34 with two output interdigital electrodes (not shown) of filter element 24 and an earth lead wire 36 is connected with the shield casing 38. The filter element 24 is mounted on circuit board 2 positioned on the one surface thereof as shown in dotted line of FIG. 1 which dotted line shows the contour of the stem or body 40 of filter element 24 as in FIG. 2.

The above stated signal patterns consist of signal patterns 10-1, 10-2, 10-3, 10-4, 10-5 and 10-6 in a signal pre-amplifier area 42 and signal patterns 10-7, 10-8 and 10-9 in a filter area 44, the signal patterns 10-1 to 10-6 in the signal amplifier area being surrounded by the earth pattern 8, as shown, to be electrically shielded from signal patterns in any other areas. With a pad 14-11 on the first signal pattern 10-1 and pad 14-E1 on the earth pattern 8 connected are a pair of lead wires of a connector (not shown) for application of signals. The first signal pattern 10-1 further has a pad 14-12 connected by a bypass capacitor 16 with a pad 14-21 on the second signal pattern 10-2 which is in turn connected at a pad 14-22 thereof with the base of a transistor 18. The transistor has its emitter connected with a pad 14-31 on the third signal pattern 10-3, and its collector connected with a pad 14-41 on the fourth signal pattern 10-4. The third signal pattern 10-3 connected with the emitter of transistor 18 is connected through another signal pattern with the earth pattern 8, and the fourth signal pattern 10-4 connected with the collector of transistor 18 is similarly connected with a voltage source (not shown). The fourth signal pattern 10-4 further has a pad 14-42 connected with a bypass capacitor 20 which is in turn connected with the input signal pattern 10-7 for the filter element 24 in the filter area 44. Thus, an input signal applied in pad 14-11 connected with the connector is fed through bypass capacitor 16 to the base of transistor 18 where the input signal is amplified, and the amplified signal is derived through bypass capacitor 20 into the signal pattern 10-7. When the foregoing circuit board is intended to form a filter part of video intermediate frequency (hereinafter called VIF) circuit, pads 14-11 and 14-E1 being coupled to the signal output terminals on a TV tuner.

With a pad 14-72 on the input signal pattern 10-7 in filter area connected is one input lead wire 28 of the acoustic surface wave filter element 24, the other input lead wire 30 of which is connected with a pad 14-E2 on the earth pattern 8. The earth lead wire 36 connected with the shield casing 38 of filter element 24 is connected with a pad 14-E3 on the earth pattern 8.

Besides the first output signal pattern 10-8, a second output signal pattern 10-9 is formed on the insulating board 4. These output signal patterns 10-8 and 10-9 extend substantially parallel to each other. They have one end positioned near one end of the input signal pattern 10-7, i.e., the pad 14-72. The output signal patterns 10-8 and 10-9 are each provided at one end with pads 14-81 and 14-91, respectively. Pads 14-81 and 14-91 are connected to the output lead wires 32 and 34 of the filter element 24, respectively. Further, the output signal patterns 10-8 and 10-9 are provided at the other end with pads 14-82 and 14-92, respectively. Pads 14-82 and 14-92 are connected to both input terminals of the differential amplifier 26 which are not maintained at earth potential. The output of the differential amplifier 26 is coupled to a circuit not shown.

As a result of the above-described circuit arrangement, a response generated by the stray capacitance or stray inductance between the input and output terminals of an ASF, i.e., between the pads 14-72 and 14-81 and between the pads 14-72 and 14-91 is reduced. This means that the influence of a parasitic filter, which is formed when an ASF is provided on a circuit board, is eliminated. The undesired response between pads 14-72 and 14-81 and the undesired response between pads 14-82 and 14-92 which could not be suppressed are made equal and then applied to the input terminals of differential amplifier 26 (i.e., pads 14-82 and 14-92). Thus, these unnecessary responses are cancelled.

Before describing individual embodiments of this invention, it will be explained why undesired response signals, typically undesired responses between the input and output terminals of an ASF, are generated.

The unnecessary response signals are assumed to be derived not from the acoustic oscillation propagated in an acoustic surface wave filter element, but from voltages generated in the output signal patterns 10-8 and 10-9 by direct induction between the input and the output patterns connected with the input and output lead wires. Such direct induction would take place because of stray capacitance and mutual inductance present between the input and the output patterns and resonance current flowing from the input signal pattern to the earth pattern. Specifically, the unnecessary response signals result from direct induction caused by the stray capacitance because a resonance current signal is transmitted through the stray capacitance between the input and output of the filter element 24 to the output signal patterns 10-8 and 10-9, thereby inducing an undesired response in the output signal pattens 10-8 and 10-9. The undesired response signals results also from direct induction caused by the mutual inductance because the resonance current flows to the mutal inductance through a resonance current path or between the input signal pattern 10-7 and the earth pattern, thereby electromagnetically inducing the undesired response in the output signal patterns 10-8 and 10-9.

Direct induction by the stray capacitance and mutual inductance will be described by reference to FIGS. 3A and 3B. The acoustic surface wave filter element is diagrammatically shown in FIG. 3A in the form of an equivalent circuit generally called "closed field model". There are in the input side of the filter element resistance 46 generated by the electromechanical conversion, resistance 50 across the input interdigital electrode, and capacitance 54 generally called clamp capacitance across the input interdigital electrode, and similarly in the output side of the filter element resistances 48 and 52, and capacitance 56. The clamp capacitance 54 has a great influence as an insertion loss as the acoustic surface wave filter element 24 has been coupled in a circuit. To lower the insertion loss by the clamp capacitance 54, an inductance 22 tuned with the clamp capacitance 54 is, as shown in FIGS. 1 and 3, connected between pads 14-71 and 14-E4 on the signal pattern 10-7 and the earth pattern 8. Additionally speaking, it has been known in the U.S. Pat. No. 3,582,838 that such an inductance as 22 is connected in the input side of the acoustic surface wave filter. The inductance 22 and the clamp capacitance 54 are connected in parallel with each other between the signal pattern 10 and the earth pattern 8, so that upon application of a signal therebetween, a resonance current is caused to flow in the earth pattern 8 which results in generation of the unnecessary response signal in output signal patterns 10-8 and 10-9. Another inductance 25 is connected between pads 14-83 and 14-93 on output signal patterns 10-8 and 10-9 for the similar purpose to that of connection of inductance 22.

Figure 3B:
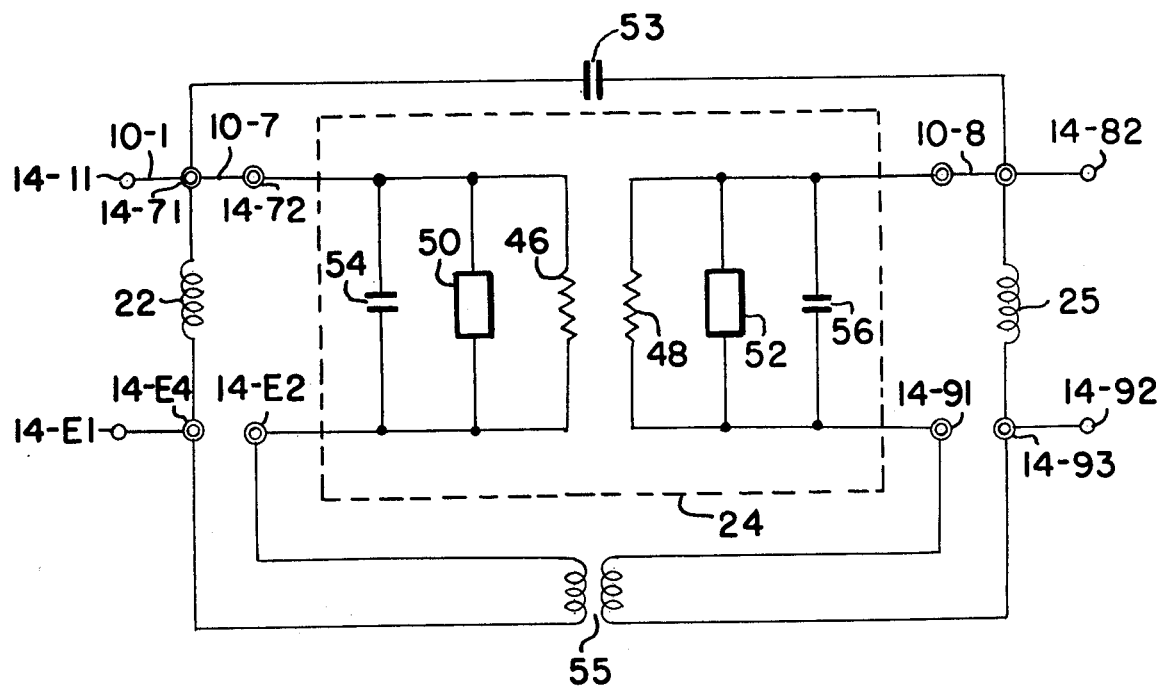
FIG. 3B is a circuit diagram showing undesired parasitic circuit elements constituting a parasitic filter when an acoustic surface element is coupled to a conventional circuit board.

FIG. 3B shows an equivalent circuit which is a combination of the equivalent circuit of the "closed field model" shown in FIG. 3A, and further includes the representation of stray capacitance 53 and mutual inductance 55. As FIG. 3B illustrates, when a resonance current signal flows between clamp capacitance 54 and inductance 22, the signal is transferred to the first signal output pattern 10-5 and the second signal output pattern 10-9 through stray capacitance 53 and mutual inductance 55. As a result, an undesired response signal is generated in each signal output pattern.

If an ASF is used, it is necessary to suppress not only a main signal which propagates in the ASF at the acoustic wave propagation speed but also a signal which is induced directly by the above-mentioned undesired response and which propagates through the space between the input and output terminals of the ASF at the electromagnetic wave propagation speed.

For example, if the filter of the VIF stage of a television receiver set includes an ASF, an undesired response signal is generated by the stray capacitance of stray inductance between the input and output terminals of the ASF and propagates through the space between the input and output terminals of the ASF. This undesired response signal will appear in a reproduced image, causing a ghost phenomenon. The undesired response generated by stray capacitance or stray inductance would degrade the frequency characteristic of the ASF. This makes it impossible to obtain a sufficient frequency characteristic for the VIF state of the television receiver set. As a result, a reproduced image will be deteriorated.

For the reasons mentioned above, it is necessary to minimize the absolute values of an undesired response generated by stray capacitance or stray inductance between the input and output terminals of an ASF, if provided on a printed circuit board.

It should be understood that because the output signal patterns 10-8 and 10-9 are arranged independently from each other on insulating board 4 and are both connected with the differential amplifier 26, without being connected with the earth pattern 6, that unnecessary response signals, if present at an equal voltage in both patterns 10-8 and 10-9, are to be cancelled by means of the differential amplifier 26. Signals intended to be derived can be amplified in the differential amplifier 26 for application from its output to the subsequent stage, since their phases are in a reversed relationship to each other in the output signal patterns.

Means for decreasing and equalizing levels of unnecessary response signals in the output signal patterns are provided in the following manner.

Referring to FIGS. 1A and 1B, the pad 14-E2 on earth pattern 8 at which one 30 of the input lead wires of acoustic surface wave filter element 24 is connected by an earth pattern portion 8-1 with the pad 14-E3 on earth pattern 8 at which the earth lead wire 36 connected with the shield casing 38 of filter element 24 is connected therewith. It is preferred that the earth pattern portion 8-1 be narrowed as much as possible.

The conductor means between the pads 14-E3 and 14-E2, i.e., the earth pattern portion 8-1, reduces an undesired response generated by stray capacitance or stray inductance between the input and output terminals of an ASF, in the following manner.

The stray capacitance between the input and output terminals of an ASF, i.e., between the pads 14-72 and 14-81 and between the pads 14-72 and 14-91, transfers an electromotive force from the input pattern 10-7 to the first output pattern 10-8 and the second output pattern 10-9. The earth pattern portion 8-1 shields this electromotive force and thus reduces the same very much, thereby minimizing the undesired response generated by the stray capacitance between the input and output terminals of the ASF.

Now it will be described how to cancel the undesired response generated by stray inductance between the input and output terminals of the ASF.

As disclosed in U.S. Pat. No. 3,582,838, an inductance 22 is connected to the input of the ASF to achieve ASF matching. The inductance 22 resonates with a stray capacitance 54 existing in the ASF element. The resonance current flows in a loop constituted by the input signal pattern 10-7, the pad 14-72, the capacitance 54, the pad 14-E3, the earth pattern 8, the pad 14-E4, the inductance 22, the input signal pattern 10-7 and the pad 14-72 and another loop constituted by the input signal pattern 10-7, the pad 14-72, the capacitance 54, the pad 14-E2, the earth pattern 8, the pad 14-E4, the inductance 22, the input signal pattern 10-7 and the pad 14-72. As shown in FIG. 3B, the resonance current generates mutual inductances 55 between the pads 14-72 and 14-81 and between the pads 14-72 and 14-91. Consequently, an undesired response signal is generated by the stray inductance between the pad 14-72 and 14-81 and between the pads 14-72 and 14-91. This undesired response signal is cancelled by the earth pattern portion 8-1.

That is, the earth pattern portion 8-1 controls the resonance current path so as to make the mutual inductances 55 equal. Further, the cut-away (non-conductive) areas 64 controls the resonance current path. These resonance current path control means equalize the mutual inductances 55, whereby the undesired response signals induced to the output signal patterns 10-8 and 10-9 are substantially equalized in magnitude. The output signal patterns 10-8 and 10-9 are coupled to the inverting and non-inverting input terminals (i.e., pads 14-82 and 14-92) of differential amplifier 26. In this manner the undesired response generated by stray inductance is cancelled by differential amplifier 26.

Thus, both an undesired response generated by stray capacitance and an undesired response generated by stray inductance can be cancelled according to this invention. Accordingly, a low pass filter and a high pass filter which are formed in an ASF element due to an undesired response generated by stray capacitance or stray inductance between the input and output terminals of the ASF are eliminated. This means that it is possible to effectively use the frequency characteristic of the ASF.

Figure 4:
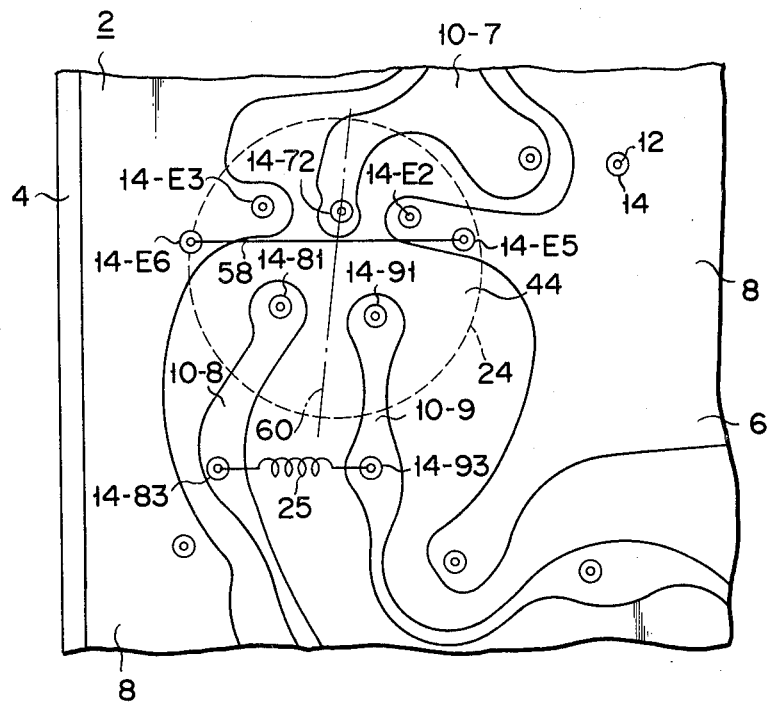
FIG. 4 is a plan view of a circuit board according to another embodiment of the invention, showing part of the surface thereof on which a circuit pattern is arrayed.

As shown in FIG. 4, a jumper line 58 which replaces the earth pattern portion 8-1 is provided to connect between a pad 14-E5 disposed on earth pattern 8 adjacent the pad 14-E2 and a pad 14-E6 disposed also on earth pattern 8 but adjacent the pad 14-E3. It is apparent that the jumper line 58 may be combined with the earth pattern portion 8-1.

In an area shown as surrounded by dotted line of FIG. 1 on the opposite surface of circuit board 4 which is corresponding to the area in which the stem or body 40 of acoustic surface wave filter element is positioned on the one surface thereof, the earth pattern 8 and the signal patterns 10-7, 10-8 and 10-9 are arrayed symmetrically of the axis 60 lying on end portion of the input signal pattern 10-7 and extending between the output signal patterns 10-8 and 10-9. The symmetrical array of patterns permits equalization of voltages induced in output signal patterns 10-8 and 10-9 by a resonance current flowing in earth pattern 8, and of stray capacitances between output signal patterns 10-8 and 10-9, voltages induced by such stray capacitances in output signal patterns 10-8 and 10-9 being thus equalized. This is described to that the symmetrical array of patterns causes the input signal pattern 10-7 and earth pattern 8 to be positioned at an equal distance from both of the output signal patterns 10-8 and 10-9. It is thus understood that without related patterns being arrayed in symmetry, pattern 10-7 and earth pattern 8 can only be arrayed equidistantly from patterns 10-8 and 10-9, acceptably to the purpose.

That portion of earth pattern 8 by which the filter area 44 is encircled has a non-conductive area 64 shown as surrounded by a dot-dash line at 62 so as to change current distribution in earth pattern 8, thereby to substantially equalize the voltage induced in output signal patterns 10-8 and 10-9.

Care is taken that the respective lead wires or pins 28, 30, 32, 34 and 36 of acoustic surface wave filter element 24 have preferably a substantially equivalent length and protrude equidistantly from the other surface of circuit board 4, or pads 14-72, 14-E2, 14-E3, 14-81 and 14-91. This helps to ensure equalization of voltages of unnecessary response signals present in the output signal patterns 10-8 and 10-9, which will be apparent in FIG. 6 hereinafter explained.

Figure 5:
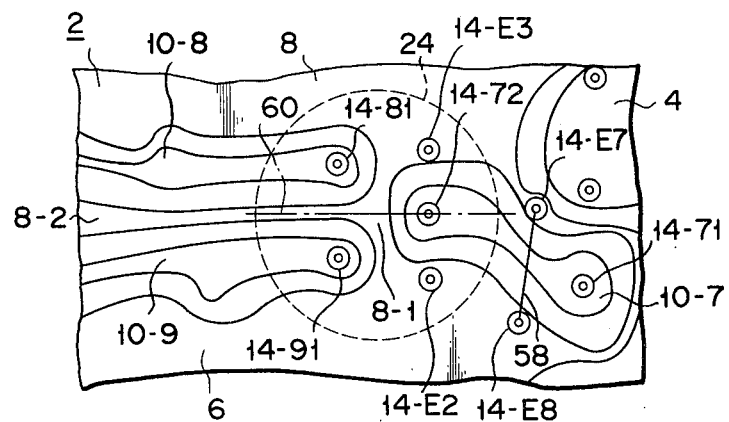
FIG. 5 is a plan view of a circuit board according to still another embodiment of the invention, showing part of the surface thereof on which a circuit pattern is arrayed.

As shown in FIG. 5, moreover, an earth pattern portion 8-2 may be provided between the in-parallel extending output signal patterns 10-8 and 10-9 to extend in substantially parallel with the latter two. The earth pattern portion 8-2 serves to shield the signal patterns 10-8 and 10-9 or influences of mutually reversed phase voltages from each other. Further, as shown in FIG. 5, a jumper line 58 is provided to extend across the input signal pattern 10-7 and connect pads 14-E7 and 14-E8. The jumper line 58 functions, combined with the earth pattern portion 8-1, to render distribution of the resonance current uniform in earth pattern 8. The jumper line 58 functions in the same way as does the earth pattern portion 8-1. Thus it is not described here how it works.

As can be understood, the jumper line 58 may be provided on either of the surfaces of circuit board 4 in so far as it is not placed in contact with signal pattern 10.

The foregoing arrangements enable the differential amplifier to cancel unnecessary response signals when the latter are derived in output signal patterns 10-8 and 10-9, while signals derived from propagation in filter element to output signal patterns are, because of having phases shifted therein, are therein simply amplified for transmission to the subsequent stage.

In a television receiver set having the VIF circuit in which the circuit board of the invention is applied, ghost images and beat patterns are avoided from occurring since unnecessary response signals are less likely to appear in the circuit board.

Experiments were conducted by the inventor in the following manner to show that the circuit board of the invention provide good characteristics of television signal frequencies. Referring to the graph of FIG. 6, a curve shown by a solid line I is indicative of frequency characteristics of the television signal provided by circuit board of the invention, and a curve shown by a broken line II is indicative of those provided by a similar circuit but wherein the input earthed lead wire 30 has a greater length than the other input and the earthing lead wires 28 and 36 to protrude at a greater distance than the latter so that stray capacitances between one of the output lead wires 32 and 34 are assumed to have a different value of stray capacitance relative to the input lead wires 28 and 36 than the other output lead wire. It is noted in the graph of FIG. 6 that symbols $S_0$, C, P and $S_1$ designate sound carrier signal in the reception channel, color carrier wave signal in the reception channel, picture carrier wave channel in the reception channel, and sound carrier signal in the lower channel to the reception one, respectively. Ideal television frequency characteristics are represented by curve I of FIG. 6 which was provided by circuit board of this invention. Curve II designated by broken line indicates an insufficient amount of attenuation of sound carrier signal $S_1$ in the lower channel. It has been generally known that sound carrier signal $S_1$ in the lower channel is required to have more than 35 dB of attenuation when color carrier wave signal C in the reception channel lies at 0 dB. Whereas curve I shows the attenuation at the order of 45 dB, curve II shows the attenuation of sound signal in the lower channel, as at $S'_1$, at the order of 34 dB which can be regarded insufficient. Such an insufficient attenuation results in generation of beat patterns in a reproduced picture of the television receiver set.

As FIG. 6 clearly shows, the stray capacitance constitutes a high pass filter and fails to completely trap the sound carrier signal S1 in the lower channel, thus inevitably causing a beat pattern. The circuit board of this invention can thus achieve a television frequency characteristic as indicated by curve I in FIG. 6.

FIG. 7 illustrates how an undesired response is generated by mutual inductance. Curve I shows the frequency characteristic of a television signal obtained by the circuit board of this invention. Curve II shows the frequency characteristic of an undesirable television signal obtained of a circuit board without the jumper line 58. If the jumper line 58 is removed from the circuit board, the resonance current flowing in the earth pattern 8 is distributed not uniformly, and the undesired response signals generated in the output signal patterns 10-8 and 10-9 come to have different levels. Namely, FIG. 7 shows how the frequency characteristic of a television signal is changed by the mutual inductance 55. The mutual inductance 55 constitutes a low pass filter and fails completely to trap the image carrier signal Po in the upper channel, thus inevitably causing a ghost image. FIG. 7 clearly shows that the mutual inductance 55 cannot fully trap the image carrier signal Po and that the sound carrier signal S1 in the lower channel cannot be fully trapped due to the stray capacitance if the jumper line 58 is removed.

It is apparent from the foregoing description that the circuit board of the invention, where unnecessary response signals are derived in the two signal circuit patterns connected with the output lead wires of an acoustic surface wave filter element, can enable the differential amplifier to cancel such unnecessary response signals so that the circuit board of the invention can be used for the VIF circuit of a television receiver set to make ghost images and beat patterns unlikely to occur.

What is claimed is:

1. A circuit board assembly comprising:
   an insulated circuit board having first and second surfaces;
   a first input signal printed conductive pattern disposed on said first surface;
   an earth printed conductive pattern disposed on said first surface;
   a second output printed conductive pattern disposed on said first surface;
   a third output conductive pattern disposed on said first surface;
   said first, second, third and earth printed conductive patterns including a plurality of holes bored through said patterns and said insulating board for receiving electrical lead wires from circuit parts disposed on said second surface;
   an acoustic surface filter having input terminals, output terminals and a ground terminal, said acoustic surface filter secured to said second surface of said insulating board, said filter having said terminals coupled to said conductive patterns through said holes;
   an inductor coupled to said input terminals of said acoustic surface filter through said first input signal conductive pattern for correcting miss-matching on the input side of said acoustic surface filter caused by stray capacitance of said acoustic surface filter;
   said earth conductive pattern coupled to said ground terminal of said acoustic surface filter for guiding in an eddy resonant current generated by the stray capacitance and said inductor;
   said second and third output signal conductive patterns coupled to said output terminals of said acoustic surface filter;
   a differential amplifier including a pair of input terminals coupled to said second and third output signal conductive patterns, respectively; and
   means coupled to one input terminal of said acoustic surface filter for controlling a current path through which a resonance current flows to said earth conductive pattern region.

2. A circuit board assembly according to claim 1 wherein each of said first, second and third conductive patterns has a first and second end, and wherein
   said first end of said first pattern is for receiving an input signal to be passed through said acoustic surface wave filter;
   said second end of said first pattern for coupling to one of said input terminals of said acoustic surface wave filter;
   said first end of said second and third patterns each coupled to an output terminal of said acoustic surface wave filter and being in close proximity to and substantially equidistant from said second end of said first pattern; and
   said means for controlling a current path comprising an earth pattern portion disposed between said first pattern and each of said second and third patterns.

3. A circuit board assembly according to claim 1 wherein each of said first, second and third conductive patterns has a first and second end, and wherein
   said first end of said first pattern is for receiving an input signal to be passed through said acoustic surface wave filter;
   said second end of said first pattern for coupling to one of said input terminals of said acoustic surface wave filter;
   said first end of said second and third patterns each coupled to an output terminal of said acoustic surface wave filter and being in close proximity to and substantially equidistant from said second end of said first pattern; and
   said means for controlling a current path comprising a jumper line coupled to said earth pattern and disposed between said second end of said first pattern and said first end of each of said second and third patterns.

4. A circuit board assembly according to claim 1 wherein said means for controlling a current path includes said earth pattern being formed in a shape for controlling the path through which the resonance current flows in said earth pattern region.

5. A circuit board assembly according to claim 2 wherein said first ends of said second and third patterns are substantially symmetrical about an axis passing through said second end of said first pattern and between said first ends of said second and third patterns.

6. A circuit board assembly according to claim 1 wherein said second and third patterns are substantially parallel to each other.

7. A circuit board assembly according to claim 1 wherein said first, second and third patterns are surrounded by said earth pattern.

8. A circuit board assembly according to claim 2 further comprising a second earth pattern coupled to said earth pattern and extending between said second and third signal patterns.

9. A circuit board assembly for a video intermediate frequency circuit comprising:
   an insulated circuit board having first and second surfaces;
   a first input signal printed conductive pattern disposed on said first surface;
   an earth printed conductive pattern disposed on said first surface;
   a second output printed conductive pattern disposed on said first surface;
   a third output conductive pattern disposed on said first surface;
   said first, second, third and earth printed conductive patterns including a plurality of holes bored through said patterns and said insulating board for receiving electrical lead wires from circuit parts disposed on said second surface;
   an acoustic surface filter having input terminals, output terminals and a ground terminal, said acoustic surface filter secured to said second surface of said insulating board, said filter having said terminals coupled to said conductive patterns through said holes;

an inductor coupled to said input terminals of said acoustic surface filter through said first input signal conductive pattern for correcting miss-matching on the input side of said acoustic surface filter caused by stray capacitance of said acoustic surface filter;

said earth conductive pattern coupled to said ground terminal of said acoustic surface filter for guiding in an eddy resonant current generated by the stray capacitance and said inductor;

said second and third output signal conductive patterns coupled to said output terminals of said acoustic surface filter;

a differential amplifier including a pair of input terminals coupled to said second and third output signal conductive patterns, respectively; and means coupled to one input terminal of said acoustic surface filter for controlling a current path through which a resonance current flows to said earth conductive pattern region.

10. A circuit board assembly according to claim 9 wherein each of said first, second and third conductive patterns has a first and second end, and wherein said first end of said first pattern is for receiving an input signal to be passed through said acoustic surface wave filter;

said second end of said first pattern for coupling to one of said input terminals of said acoustic surface wave filter;

said first end of said second and third patterns each coupled to an output terminal of said acoustic surface wave filter and being in close proximity to and substantially equidistant from said second end of said first pattern; and said means for controlling a current path comprising an earth pattern portion disposed between said first pattern and each of said second and third patterns.

11. A circuit board assembly according to claim 9 wherein each of said first, second and third conductive patterns has a first and second end, and wherein said first end of said first pattern is for receiving an input signal to be passed through said acoustic surface wave filter;

said second end of said first pattern for coupling to one of said input terminals of said acoustic surface wave filter;

said first end of said second and third patterns each coupled to an output terminal of said acoustic surface wave filter and being in close proximity to and substantially equidistant from said second end of said first pattern; and said means for controlling a current path comprising a jumper line coupled to said earth pattern and disposed between said second end of said first pattern and said first end of each of said second and third patterns.

12. A circuit board assembly according to claim 9 wherein said means for controlling a current path includes said earth pattern being formed in a shape for controlling the path through which the resonance current flows in said earth pattern region.

13. A circuit board assembly according to claim 10 wherein said first ends of said second and third patterns are substantially symmetrical about an axis passing through said second end of said first pattern and between said first ends of said second and third patterns.

14. A circuit board assembly according to claim 9 wherein said second and third patterns are substantially parallel to each other.

15. A circuit board assembly according to claim 9 wherein said first, second and third patterns are surrounded by said earth pattern.

16. A circuit board assembly according to claim 10 further comprising a second earth pattern coupled to said earth pattern and extending between said second and third signal patterns.

* * * * *